HEAT-DISSIPATING SUPPORT FOR SEMICONDUCTOR DEVICE

Filed Dec. 29, 1965

INVENTOR
Unto U. Savolainen

BY Edward J. Connors

ATTORNEY

United States Patent Office 3,399,332

Patented Aug. 27, 1968

3,399,332

HEAT-DISSIPATING SUPPORT FOR SEMICONDUCTOR DEVICE

Unto U. Savolainen, Attleboro, Mass., assignor to Texas Instruments Incorporated, Dallas, Tex., a corporation of Delaware Filed Dec. 29, 1965, Ser. No. 517,350
10 Claims. (Cl. 317—234)

ABSTRACT OF THE DISCLOSURE

A heat-dissipating support for a device of selected coefficient of thermal expansion such as a semiconductor device is shown to comprise a layer of metal of relatively high thermal conductivity and coefficient of thermal expansion having a metal grid embedded in the layer, the metal of the grid having a coefficient of thermal expansion substantially lower than that of the metal layer for restraining thermal expansion of the layer to substantially match the thermal expansion of the semiconductor device.

This invention relates to headers and more particularly to heat dissipating headers for high-powered transistor devices and the like.

In the operation of a high-powered device, it is necessary that the heat generated in the operation of the device be dissipated and conducted away from the device so that the device will not have to operate in an environment above a specified temperature. Therefore, it is necessary that the device be mounted upon a support which is a good thermal conductor. However, it has been found that good thermal conductors usually do not have the same coefficient of expansion as the material of which semiconductor devices are made. This presents a problem resulting from the heating of two dissimilar metals. Each metal expands due to the heat, one of the metals expanding more than the other. The metal having the greatest expansion, if bonded to the other metal, may cause bending and rupturing of the bond between the two metals or between one of the metals and a device mounted thereupon. It is therefore one object of this invention to provide a mounting for a semiconductor device which will dissipate heat rapidly and match the expansion of the material from which the device is made.

Still another object of the invention is a semiconductor header made from a composite of more than one metal.

Still another object of the invention is to embed a material with a low thermal coefficient of expansion in one having a high coefficient expansion to make a composite header having a desired coefficient of expansion.

Other objects and features of the invention will become more readily understood from the following detailed description and appended claims when considered in conjunction with the accompanying drawing in which like reference numerals designate like parts throughout the figure thereof, and in which:

Figures 1, 2, 3, 4, 5:
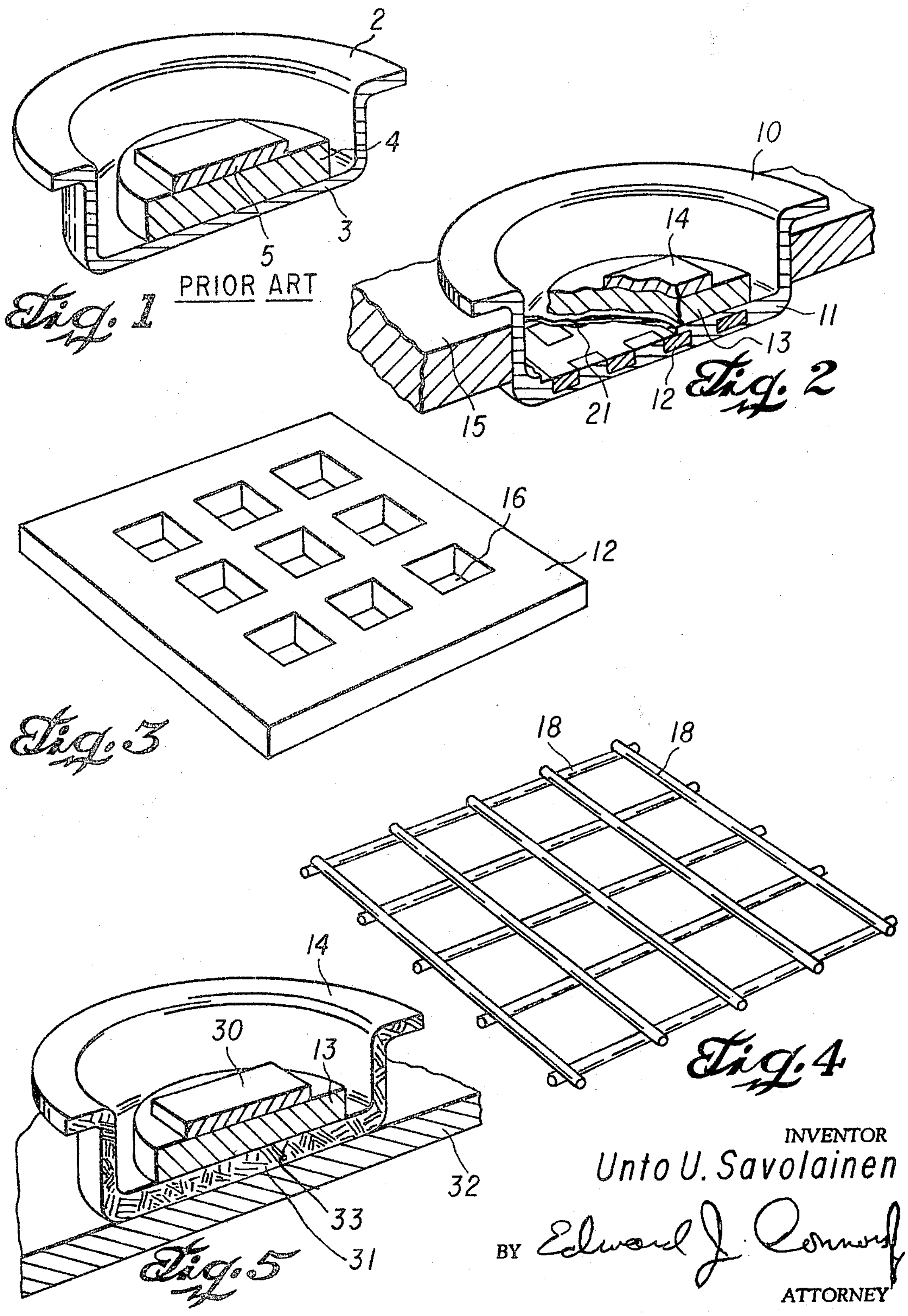
FIGURE 1 is a sectional view of a semiconductor header of the prior art.
FIGURE 2 is a semiconductor header embodying a grid structure within the mounting base to alter the coefficient of expansion of said mounting base.
FIGURE 3 is a punched out grid structure used in the header shown in FIGURE 2.
FIGURE 4 is a second embodiment of a grid structure which may be used in the header of FIGURE 2.
FIGURE 5 is another embodiment of the present invention having a random distribution of an alloy embedded within the head to alter the coefficient of the expansion of the header material.

Referring now to the drawing there is shown in FIGURE 1, a header with a semiconductor device mounted thereon as practiced in the prior art. Shown is a header 2 having a bottom portion 3 which, for example, may be made from copper, a high thermal conducting material. Mounted on the part 3 of the header, is a metallic block 4 which is most commonly of molybdenum. Secured to the molybdenum block 4 is a semiconductor wafer 5 which may be, for example, silicon. The silicon wafer is soldered with a gold solder to the molybdenum block. The thermal properties of the various materials heretofore named are as follows:

| | Thermal Conductivity, cal./cm.²/cm./° C./sec. | Thermal Expansion, cm./cm./° C. |
|---|---|---|
| Silicon | 0.20 | $4.68\times10^{-6}$ |
| Molybdenum | 0.35 | $4.9\times10^{-6}$ |
| Copper | 0.94 | $16.5\times10^{-6}$ |

From this it may be observed that the thermal coefficients of expansion between the silicon and molybdenum are approximately the same, however, copper has a greater thermal coefficient of expansion than the molybdenum. In power devices, large amounts of heat are generated and must be dissipated. The heat flow from the silicon wafer is through the molybdenum block and the copper header. Since the coefficient of the expansion between the copper and the molybdenum is in a ratio of almost 4 to 1, it is possible that the copper expansion would be about 4 times greater than that of the molybdenum. Since the two are bonded together, there is caused a bowing or bending of the two bonded metals, which in turn can cause damage to the semiconductor or cause the molybdenum block to break loose from its bond to the copper.

To dissipate the heat generated in the silicon wafer, the molybdenum is used because its thermal expansion is close to that of silicon and because it has a good thermal conductivity. In order to dissipate the heat from the molybdenum, it is desirable that the molybdenum be mounted upon a surface which has a high thermal conductivity. Since copper does have a high thermal conductivity, it would be very desirable if it were not for the high thermal expansion of the copper which produces stresses resulting in bending of the structure. This bending results in a fracturing of the bonds between the silicon, molybdenum and copper.

One way of overcoming the thermal bending due to the differential expansion is to embed a layer of material having a thermal expansion similar to molybdenum, for example an iron-nickel-cobalt alloy such as F–15 alloy, within the copper header base as shown in FIGURE 2. F–15 alloy is an alloy having the nominal composition of 53% iron, 29% nickel and 17% cobalt covered by the American Society for Testing and Materials Specification F15–61T. It is also commonly known as Kovar, a trade name of the Westinghouse Electric Corporation. The cup-like header shown in FIGURE 2 is similar to that in FIGURE 1, however, with one important difference. The header 10 with the base portion 11 has embedded therein a grid of an alloy having a thermal coefficient of expansion close to that of molybdenum. One such alloy, as mentioned before, is an iron-nickel-cobalt alloy. The grid is embedded in the copper base so that the copper is on each side of the grid and extending through the openings therein.

Examples of suitable grids are shown in FIGURES 3 and 4. The grid in FIGURE 3 is a sheet 12 of the alloy having holes 16 punched therein and the grid in FIGURE 4 is made from strips 18 of the alloy welded together to form a grid network. Iron-nickel-cobalt alloys such as Kovar have an expansion of about $5.0\times10^{-6}$ cm./cm./

° C. which is very close to that of molybdenum. However, the thermal conductivity is very poor, being only a few percent that of copper.

To overcome the poor heat dissipating effects of the alloy and to take advantage of the thermal expansion properties, the header base of copper and alloy is made as described above. The heat flow is from the molybdenum block through the copper portion of the base in the openings in the alloy network. The thermal conductivity in general is proportional to the area of the perforations, therefore, the perforations may be made of a suitable size to obtain the desired heat flow. In addition, the header may be mounted in a surface 15 so that there may be additional heat flow through the walls of the header and into the mounting surface. The alloy grid, when combined with the copper, restricts the expansion of the copper resulting in an overall thermal expansion near to that of the molybdenum. Since the alloys and the copper are not bonded together in two parallel layers, the difference in thermal coefficients of the two materials is not critical since no bending results within the structure. Because Kovar and other similar nickel base alloys have a low expansion, a much higher modulus of elasticity and a much higher yield strength than the copper, they restrict the expansion effects of the copper. The thermal expansion of the low expansion grid and copper composite structure approximates that of the molybdenum over a wide range of grid/copper ratios. For example, if the grid is 40% of the volume of the composite the thermal expansion will be $6.0 \times 10^{-6}$ cm./cm./° C. Other composition ratios give values as shown:

| Grid volume as percent of composite: | Thermal expansion cm./cm./° C. |
|---|---|
| 35 | $6.5 \times 10^{-6}$ |
| 40 | $6.0 \times 10^{-6}$ |
| 50 | $5.6 \times 10^{-6}$ |
| 60 | $5.4 \times 10^{-6}$ |

FIGURE 5 is another embodiment of the invention. The copper header material is impregnated with a random orientation of metal particles having a high modulus and a lower thermal expansion. Iron-nickel-cobalt alloys generally fall within this classification. The embedded particles restrict the thermal expansion of the composite material but still allows good thermal conduction. The entire header 14 may be fabricated from copper impregnated with the particles 33. The device 30 is mounted on molybdenum block 13, which is in turn bonded to the header base 31. Heat flow is through the copper portion of base 31 to the mounting surface 32.

Although the present invention has been shown and illustrated in terms of specific preferred embodiments, it will be apparent that changes and modifications are possible without departing from the spirit and scope of the invention as defined in the appended claims.

What is claimed is:

1. A heat-dissipating material for supporting devices of predetermined coefficient of thermal expansion comprising a layer of metal of selected thermal conductivity and coefficient of thermal expansion, and a metal grid embedded in said metal layer, said grid being formed of a metal of relatively lower thermal conductivity and coefficient of thermal expansion than said metal of said layer for restraining thermal expansion of said layer.

2. A material as set forth in claim 1 wherein said grid comprises a perforated sheet of metal extending in a central plane through said metal layer, said grid being bonded to said metal of said layer.

3. A Material as set forth in claim 1 wherein said grid comprises a plurality of metal strips welded together to form a mesh-like structure, said mesh-like structure extending in a central plane through said metal layer and being bonded to said metal of said layer.

4. A semiconductor structure comprising semiconductor means of predetermined coefficient of thermal expansion and a heat-dissipating support secured to said semiconductor means, said support having a layer of metal of selected thermal conductivity and coefficient of thermal expansion and having a metal grid embedded in said metal layer, said grid being formed of a metal of relatively lower thermal conductivity and coefficient of thermal expansion than said metal of said layer for restraining thermal expansion of said layer to substantially match said thermal expansion of said semiconductor means.

5. A semiconductor structure as set forth in claim 4 wherein said semiconductor means comprises a semiconductor body and a mounting body of substantially matching coefficients of thermal expansion, said mounting body being secured at one side to said semiconductor body and at an opposite side to said heat-dissipating support.

6. A semiconductor structure as set forth in claim 5 wherein said semiconductor body comprises a silicon wafer, said mounting body is formed of molybdenum, and said layer of metal in said support is formed of copper.

7. A semiconductor structure as set forth in claim 6 wherein said grid is formed of an iron-nickel-cobalt alloy.

8. A semiconductor structure as set forth in claim 4 wherein a limited portion of said support is secured to said semiconductor means, said grid being restricted to said portion of said support.

9. A semiconductor structure as set forth in claim 4 wherein said grid comprises a perforated sheet of metal extending in a central plane through said metal layer, said grid being bonded to said metal of said layer.

10. A semiconductor structure as set forth in claim 4 wherein said grid comprises a plurality of metal strips welded together to form a mesh-like structure, said mesh-like structure extending in a central plane through said metal layer and being bonded to said metal of said layer.

References Cited

UNITED STATES PATENTS

| | | | |
|---|---|---|---|
| 2,796,563 | 6/1957 | Ebers et al. | 317—235.5 |
| 3,097,329 | 7/1963 | Siemens | 317—234.5 |
| 3,128,419 | 4/1963 | Waldkotter et al. | 317—234.1 |
| 3,153,581 | 10/1964 | Hutchins | 317—234.5 |
| 3,204,158 | 8/1965 | Schreiner et al. | 317—234.5 |
| 3,226,608 | 12/1965 | Coffin | 317—234.5 |

JAMES D. KALLAM, *Primary Examiner.*